United States Patent
Arai

(10) Patent No.: US 6,788,068 B2
(45) Date of Patent: Sep. 7, 2004

(54) METHOD AND DEVICE FOR MEASURING PURE RESISTANCE OF ON-VEHICLE BATTERY BY PERIODICALLY MEASURING A DISCHARGE CURRENT AND TERMINAL VOLTAGE WHILE A RUSH CURRENT FLOWS INTO A CONSTANT LOAD

(75) Inventor: Youichi Arai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/155,214

(22) Filed: May 28, 2002

(65) Prior Publication Data
US 2002/0186019 A1 Dec. 12, 2002

(30) Foreign Application Priority Data

May 28, 2001 (JP) .......................................... 2001-200057
Aug. 3, 2001 (JP) .......................................... 2001-236962

(51) Int. Cl.[7] ............................................. G01N 27/416
(52) U.S. Cl. ........................................ 324/430; 324/425
(58) Field of Search ........................... 320/48, 160; 324/426, 324/427, 430, 432, 434, 425; 340/636

(56) References Cited

U.S. PATENT DOCUMENTS

| 5,281,919 | A | * | 1/1994 | Palanisamy | ................. | 324/427 |
| 5,929,609 | A | * | 7/1999 | Joy et al. | ....................... | 322/25 |
| 6,388,447 | B1 | * | 5/2002 | Hall et al. | .................. | 324/426 |

* cited by examiner

Primary Examiner—N. Le
Assistant Examiner—Walter Benson
(74) Attorney, Agent, or Firm—Armstrong, Kratz, Quintos, Hanson & Brooks, LLP

(57) ABSTRACT

A discharge current and terminal voltage of the battery are periodically measured while a rush current flows into a predetermined constant load of the loads. The rush current first monotonically increases from zero to a peak value and subsequently monotonically decreases from the peak value to a steady value. A first approximate expression of a current-voltage characteristic for the increasing discharge current and a second approximate expression of a current-voltage characteristic for the decreasing discharge current are computed. An intermediate value of two values of the terminal voltage change per unit current change at points corresponding to the peak values of the first and second approximate expressions excluding a voltage drop caused by a concentration polarization component is computed when the first and second approximate expressions include the voltage drop. The intermediate value computed is measured as the pure resistance of the battery.

13 Claims, 11 Drawing Sheets

METHOD AND DEVICE FOR MEASURING PURE RESISTANCE OF ON-VEHICLE BATTERY BY PERIODICALLY MEASURING A DISCHARGE CURRENT AND TERMINAL VOLTAGE WHILE A RUSH CURRENT FLOWS INTO A CONSTANT LOAD

BACKGROUND OF THE INVENTION (1) Field of the Invention

The present invention relates to a method and device for measuring a pure resistance of an on-vehicle battery, which is mounted on a vehicle to supply electric power to loads in the vehicle.

(2) Description of the Related Art

In general, a battery can repeatedly be used within a range of its charging capacity by carrying out a charge which compensates a discharge thereof. However, when an unexpected event such as a deep discharge and lack of electrolyte takes place or even when the battery is used for a long period of time, repeated charges cause a rapid deterioration in chargeable capacity that corresponds to the electric power to be supplied to loads by discharge. Consequently, in a state that the chargeable capacity deteriorates as a result of the aging of the battery, an engine of a vehicle might not be started again when a starter motor is started after a stoppage of the engine, even if the discharge exceeding the charge takes place for a short period of time.

In this connection, when a new battery is compared with a battery in which the aging takes place, it is known that the latter has a pure resistance greater than that of the former. This is a reason why the measured pure resistance of a battery is a measure of replacing the battery when the vehicle is periodically inspected. By knowing the pure resistance, the degree of the deterioration of the battery can be defined taking the pure resistance and the polarization resistance component into consideration. When the pure resistance is determined, its value can be used to estimate the open circuit voltage of the battery.

In general, when current is discharged from a battery, it causes a voltage drop in the terminal voltage of the battery. The voltage drop is caused by an internal impedance (combined resistance) of the battery and is divided into a voltage drop due to IR loss (pure resistance, i.e. voltage drop due to ohmic resistance) caused by the structure of the battery and a voltage drop due to the polarization resistance component (activation polarization, concentration polarization) caused by a chemical reaction. As shown in FIG. 11, when a current-voltage characteristic (I–V characteristic) is computed, the voltage drop due to IR loss does not change provided that the battery state remains the same. On the other hand, the voltage drop resulting from the polarization resistance component changes depending upon the magnitude of the current and a period of the discharging time. When various states of the battery are estimated on the basis of the I–V characteristic including such a polarization resistance component, an accurate estimation cannot be obtained. This is a reason why a technique for measuring the pure resistance of the battery is necessary. The pure resistance can be obtained by separating the polarization resistance component out from the voltage drop in the terminal voltage of the battery.

As for an instrument generally used so far for measuring the pure resistance of a battery, the pure resistance is measured when the battery is in its static condition, that is, when neither the voltage rise nor the voltage drop resulting from the polarization and so on takes place in the electrolyte caused by charge or discharge.

As an example, there is a method for computing the pure resistance of a battery in which the battery is subjected to a repeated charge and discharge process by applying an alternating current with a frequency from 1 kHz to 100 kHz and in a condition that no polarization of charge or discharge is stored in the battery the pure resistance is computed from a relationship between voltage and current, which changes in a specific period of time, for example, 1 $\mu$sec.

That is, as shown in FIG. 12, after a charge is halted a phenomenon is investigated, in which the voltage recovers rapidly and thereafter gradually recovers. Supposing that said rapid recovery within a period of time $\Delta t$ arises only as a result of the pure resistance R and said gradual recovery arises as a result of the other components (capacitance and inductance components) including the polarization excluding the pure resistance, a change in the voltage and current in a short period of time in each applied cycle of the alternating current with a frequency from 1 kHz to 100 kHz is investigated so as to measure the pure resistance.

However, when an on-vehicle battery is a subject for the above mentioned technique, the static condition of the battery exists in a very limited period of time and such a technique cannot be used when the vehicle is in operation.

Moreover, in the example described above, because the data of the voltage V and current I must be collected in a short period of time, that is, because the sampling during a short periodic period of time together with their analog/digital conversion must be carried out in a specific period of time $\Delta t$, therefore although it can indeed be used as an instrument which can be used independently, to use it while mounting it on the vehicle is very hard to do. Further, in order to make the computed $\Delta V/\Delta I$ to be accurate each value of $\Delta V$ and $\Delta I$ inevitably must be large, however in the vehicle a case in which such a condition is established is very much limited. Consequently, the technique described above cannot be applied to a case in which the pure resistance of an on-vehicle battery must be measured when the vehicle is in operation.

SUMMARY OF THE INVENTION

It is therefore an objective of the present invention to solve the above problem and to provide a method and device for measuring a pure resistance of an on-vehicle battery, by which the pure resistance of the battery can be measured even when the vehicle is in operation.

In order to attain the above objective, the present invention provides a method of measuring a pure resistance of an on-vehicle battery for supplying electric power to loads in the vehicle comprising the steps of:

periodically measuring a discharge current and terminal voltage of the battery while a rush current flows into a predetermined constant load of the loads, the rush current first monotonically increasing from zero to a peak value and subsequently monotonically decreasing from the peak value to a steady value;

computing a first approximate expression of a current-voltage characteristic for the increasing discharge current and a second approximate expression of a current-voltage characteristic for the decreasing discharge current, said current-voltage characteristic indicating a correlation between the discharge current and terminal voltage of the battery; and computing an intermediate value of two values of the terminal voltage change per unit current change at points corresponding to the peak values of the first and second approximate expressions excluding a voltage drop caused by a concentration polarization component when the first and second approximate expressions include the voltage drop, wherein the intermediate value computed is taken as a measurement of the pure resistance of the battery.

With the construction described above, the discharge current and terminal voltage of the battery are measured when an electric power is supplied to a load in a normal operation of a vehicle. The pure resistance of the battery can be computed only by processing the data thus measured.

That is, the present invention provides a method of measuring a pure resistance of an on-vehicle battery, by which the pure resistance of the battery can be measured even when the vehicle is in operation.

Preferably, the intermediate value is computed by averaging the two values of the terminal voltage change.

With the construction described above, the present invention provides a method of measuring a pure resistance of an on-vehicle battery, by which the pure resistance of the battery can be accurately measured when the change in the activation polarization at a point corresponding to the peak value becomes the same.

Preferably, each said value of the terminal voltage change is first multiplied by a corresponding ratio of a monotonic increase period of time and a monotonic decrease period of time of the rush current among a total period of time of the rush current flow, respectively, and subsequently the intermediate value is computed by averaging the two multiplied values of the terminal voltage change.

With the construction described above, the present invention provides a method of measuring a pure resistance of an on-vehicle battery, by which the pure resistance of the battery can be accurately measured when the change in the activation polarization at a point corresponding to the peak value does not become the same.

Preferably, if the first and second approximate expressions are quadratic, upon computation of the intermediate value, first and second modified approximate expressions are computed, in which the voltage drop caused by the concentration polarization component is excluded, from the first and second approximate expressions, respectively, and two values of the terminal voltage change per unit current change at points corresponding to the peak values of the first and second modified approximate expressions are computed.

With the construction described above, the present invention provides a method of measuring a pure resistance of an on-vehicle battery, by which the pure resistance of the battery can be measured by a simple computation.

Preferably, a difference between the terminal voltage of the battery at a point of the discharge current being zero of the first and second approximate expressions is computed, the difference is characterized as a voltage drop caused by a total concentration polarization component arisen while the rush current increases from zero to a peak value and decreases from the peak value to zero, a voltage drop caused by a concentration polarization component which arises while the rush current increases from zero to the peak value among the total concentration polarization component is computed, and a quadratic expression, a second-order coefficient of which is determined by substituting a value, which is obtained by subtracting said voltage drop from a voltage value corresponding to the peak value, into an expression having the same constant and first-order coefficient as those of the first quadratic approximate expression, is computed as the first modified approximate expression.

With the construction described above, the present invention provides a method of measuring a pure resistance of an on-vehicle battery, by which the modified approximate expression excluding the concentration polarization component can be accurately obtained and therefore, the pure resistance of the battery can be accurately measured.

Preferably, besides a voltage value excluding a voltage drop caused by the concentration polarization component at the peak value, two voltage values excluding a voltage drop caused by a concentration polarization component between a peak value and zero are computed and a quadratic expression, a coefficient of which is determined by using the three voltage values, is computed as the second modified approximate expression.

With the construction described above, the present invention provides a method of measuring a pure resistance of an on-vehicle battery, by which the pure resistance of the battery can be measured without a complicated process.

Preferably, differential values of the first and second modified approximate expression at a peak value are used for computing the intermediate value.

With the construction described above, the present invention provides a method of measuring a pure resistance of an on-vehicle battery, by which the pure resistance of the battery can be measured by a simple computation.

Preferably, besides a voltage value excluding a voltage drop caused by the concentration polarization component at the peak value, two voltage values excluding a voltage drop caused by a concentration polarization component at zero point and at an intermediate point between a peak value and zero are computed and a quadratic expression, a coefficient of which is determined by using the three voltage values, is computed as the second modified approximate expression.

With the construction described above, the present invention provides a method of measuring a pure resistance of an on-vehicle battery, which includes a smaller amount of processing needed for computing the approximate expression excluding the concentration polarization component.

Preferably, besides a voltage value excluding a voltage drop caused by the concentration polarization component at the peak value, a voltage value excluding a voltage drop caused by a concentration polarization component at an intermediate point between a peak value and zero is computed, a linear expression determined by connecting two points of said voltage value is computed as the second modified approximate expression, and a gradient of the second modified approximate expression is used for computing the intermediate value.

With the construction described above, the present invention provides a method of measuring a pure resistance of an on-vehicle battery, by which the process for computing the intermediate value becomes simple.

Preferably, a voltage drop caused by a concentration polarization component arising while the rush current increases from zero to the peak value among the total concentration polarization component is computed by multiplying a difference between the terminal voltage of the battery at a point of the discharge current being zero of the first and second approximate expressions, by a ratio of a current-time product while the rush current increases from zero to a peak value to a current-time product while the rush current first increases from zero to a peak value and subsequently decreases from the peak value to zero.

With the construction described above, the present invention provides a method of measuring a pure resistance of an on-vehicle battery, by which the first modified approximate expression excluding the concentration polarization component can be accurately obtained. Thereby, the pure resistance of the battery can be accurately measured.

Preferably, difference expression, which is a difference between the first and second approximate expressions, is calculated and thereafter, a voltage drop caused by a concentration polarization component arisen while the rush current changes from zero to the peak value is computed according to the steps of:

- calculating a first difference in the terminal voltage of the battery between the first and second approximate expressions at a point of the discharge current being zero;
- calculating a second difference between voltage values at a current value being zero and at a current value being twice the peak current value calculated on the basis of said difference expression;
- calculating a third difference between voltage values at the peak current value and at twice the peak current value; and
- computing the voltage drop by multiplying the first difference by the ratio of the third difference to the second difference.

With the construction described above, the present invention provides a method of measuring a pure resistance of an on-vehicle battery by which the method is not affected by a relation between the current-time product and the generation of the concentration polarization. A complicated process becomes unnecessary and therefore, the pure resistance of the battery can be simply and accurately measured.

Preferably, when the rush current, which monotonically increases up to a peak value in a short period of time without an occurrence of concentration polarization, flows into the constant load, the first approximate expression is linear and a gradient of the first approximate expression is used for computing the intermediate value.

With the construction described above, the present invention provides a method of measuring a pure resistance of an on-vehicle battery, by which the process for computing the pure resistance becomes simple and the approximate expression can be simply computed.

In order to attain the above objective, the present invention also provides a device for measuring a pure resistance of an on-vehicle battery for supplying electric power to loads in the vehicle comprising:

- measuring means for periodically measuring a discharge current and terminal voltage of the battery while a rush current flows into a predetermined constant load of the loads, the rush current first monotonically increasing from zero to a peak value and subsequently monotonically decreasing from the peak value to a steady value;
- first computing means for computing a first approximate expression of a current-voltage characteristic for the increasing discharge current and a second approximate expression of a current-voltage characteristic for the decreasing discharge current, said current-voltage characteristic indicating a correlation between the discharge current and terminal voltage of the battery measured by the measuring means; and
- second computing means for computing an intermediate value of two values of the terminal voltage change per unit current change at points corresponding to the peak values of the first and second approximate expressions excluding a voltage drop caused by a concentration polarization component when the first and second approximate expressions include the voltage drop,
- wherein the intermediate value computed by the second computing means is measured as the pure resistance of the battery.

With the construction described above, the discharge current and terminal voltage of the battery are measured when an electric power is supplied to a load in a normal operation of a vehicle. The pure resistance of the battery can be computed by processing only the data thus measured.

DESCRIPTION OF THE PREFERRED EMBODIMENTS

In the following, preferred embodiments for a method of measuring a pure resistance of an on-vehicle battery according to the present invention will be explained with reference to FIGS. 3–9, before preferred embodiments of a device for measuring a pure resistance of an on-vehicle battery according to the present invention will be explained with reference to FIG. 2.

On a 12V-vehicle, 42V-vehicle, EV vehicle and HEV vehicle, there is mounted a constant load such as a starter motor, motor generator and drive motor which requires a large current, as a load on a vehicle, which acts by an electric power supplied from a battery. For example, when the constant load, such as a starter motor, is turned on, a rush current flows into the constant load at an initial stage of the start of the drive and thereafter a current of a steady value flows thereinto according to the magnitude of the load.

Figure 3:
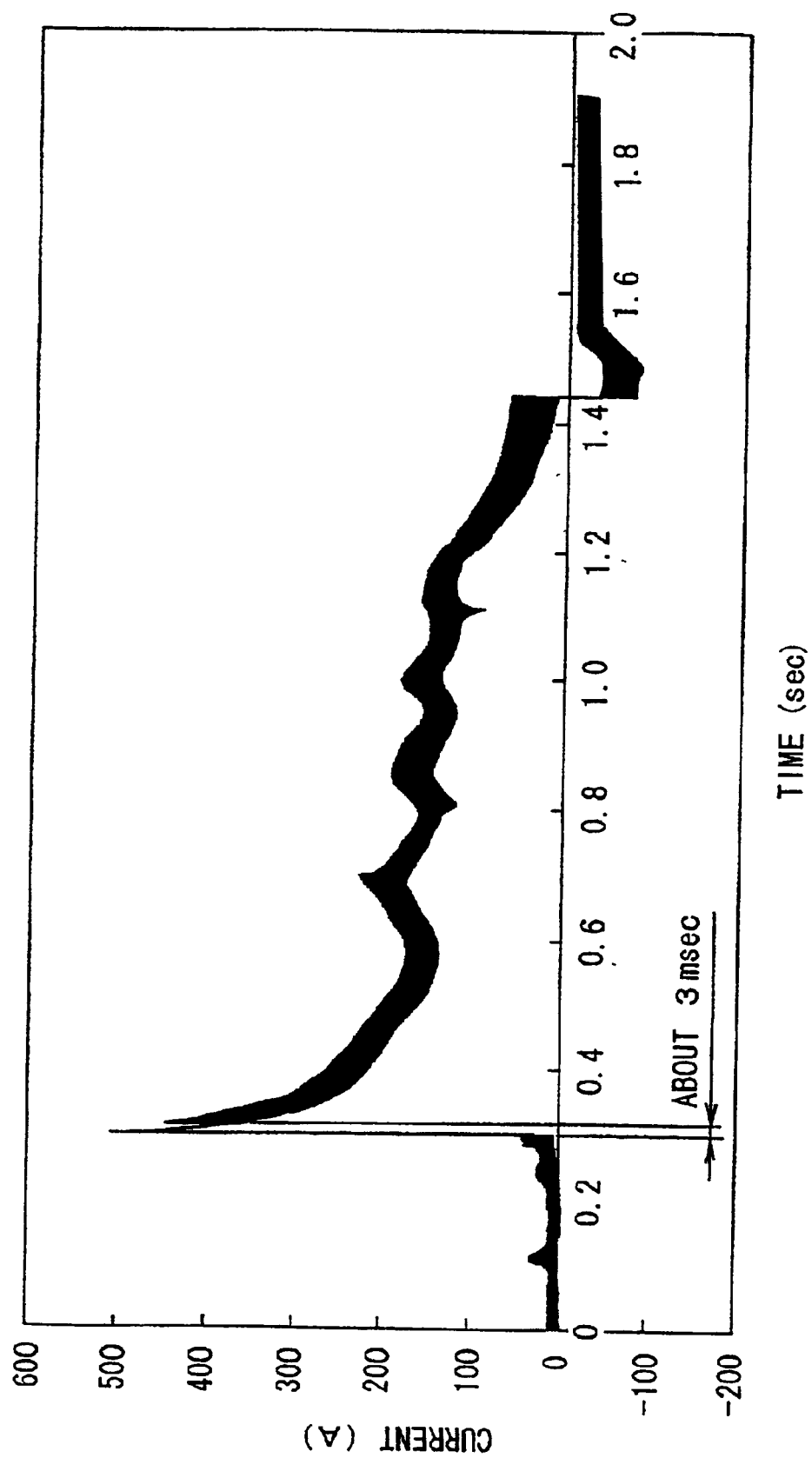
FIG. 3 is a graph illustrating an example of discharge current with a rush current upon start of a starter motor driving.

When a direct current motor is used as a starter motor, as shown in FIG. 3, a rush current flowing into a field coil monotonically increases from about zero up to a peak value, which is considerably larger than the steady current, such as 500 (ampere) in a short period of time such as 3 msec (milli-second) just after the start of the drive of the constant load, and thereafter monotonically decreases from the peak value to a steady value according to the magnitude of the constant load in a short period of time such as 150 msec, wherein the rush current is a discharge current supplied from a battery. Therefore, when the rush current flows into the constant load, a discharge current of a battery and a terminal voltage corresponding to the discharge current are measured, thereby a discharge current (I)—terminal voltage (V) characteristic (i.e., I–V characteristic) of the battery, which shows how a terminal voltage changes relatively to a discharge current, which varies within a wide range from zero to a peak value, can be measured.

As a simulation of discharge, which corresponds to a rush current flowing when a starter motor is turned on, by using an electronic load, a battery was subjected to a discharge, in which the discharge current increased from zero to 200 A in 0.25 second and thereafter decreased from 200 A to zero in 0.25 second. A pair of the discharge current and terminal voltage of the battery were measured with a short constant frequency, and on the basis of thus obtained data of the pair, a graph shown in FIG. 4 was obtained by plotting values of the discharge current on the horizontal axis and plotting values of the terminal voltage on the longitudinal axis. The current-voltage characteristic during the increase and decrease in the discharge current as shown in FIG. 4 is approximately expressed by the following quadratic expressions by using least squares method:

$$V=a1I^2+b1I+c1 \quad (1)$$

$$V=a2I^2+b2I+c2. \quad (2)$$

Figure 4:
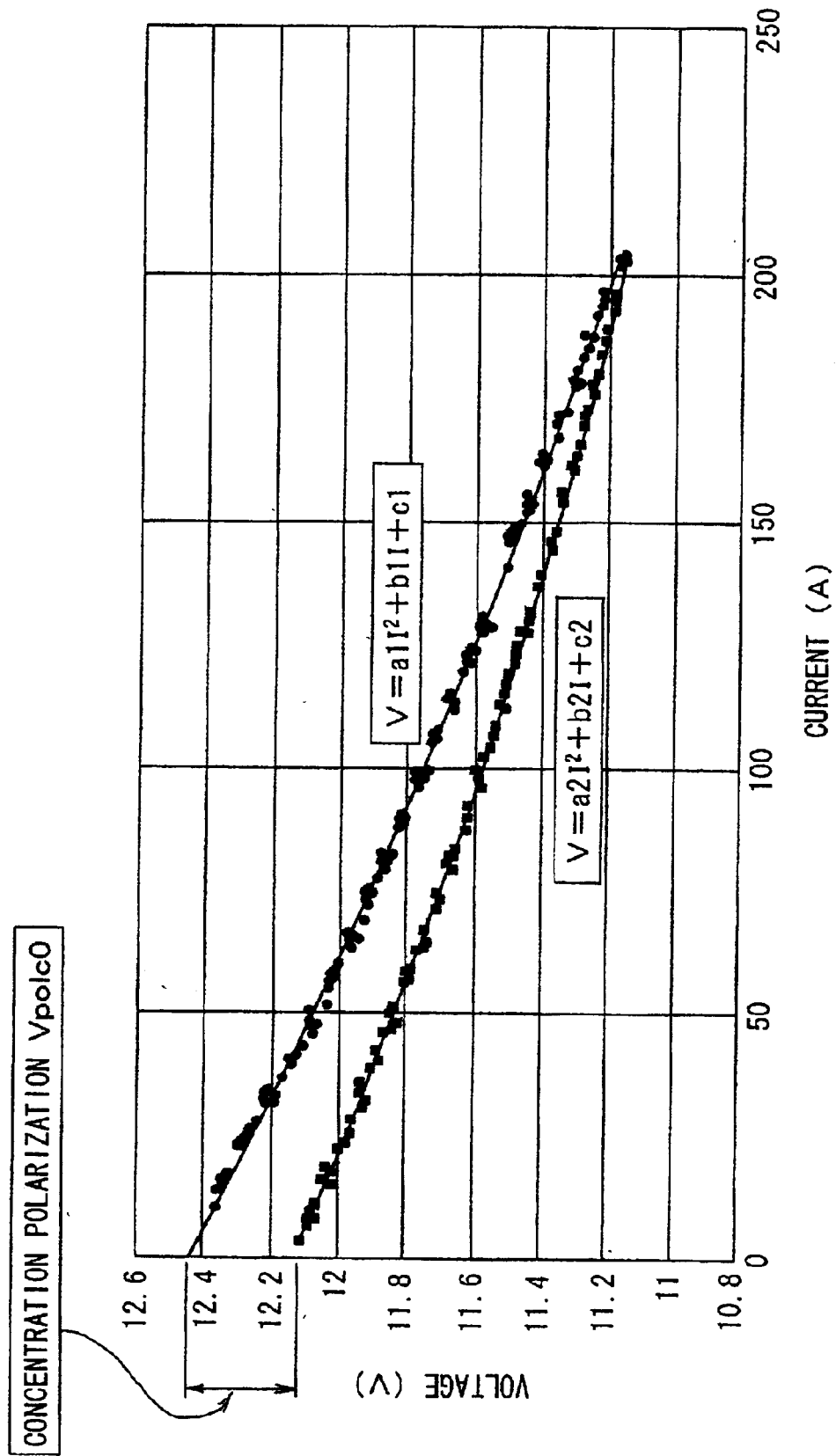
FIG. 4 is a graph illustrating an example of an I–V characteristic expressed by a quadratic approximate expression.

In FIG. 4, there is drawn a curve of a quadratic approximate expression.

In FIG. 4, because a voltage difference between the intercepts on the longitudinal axis of the approximate curve for the increase of the current and that for the decrease of the current is a voltage difference when the current is 0 A, therefore the voltage difference is considered to be a voltage drop resulting from only the concentration polarization component newly arisen caused by the discharge, which includes neither a voltage drop due to the pure resistance nor a voltage drop due to the activation polarization. That is, the voltage difference depends on only the concentration polarization at the current=0 A, which is here expressed by Vpolc0. The concentration polarization Vpolc0 is a product of the magnitude of the rush current and a period of time while the current flows and expressed by a unit of Ah (ampere×hour), which is hereinafter shown by a unit of Asec (ampere×second).

In the following, a method will be explained, by which the concentration polarization Vpolc0 at the current=0 A is used so as to compute a concentration polarization at a peak value of the current. Supposing that the concentration polarization at the current peak value be Vpolcp, then Vpolcp is expressed by:

$$Vpolcp=[(A\sec \text{ during the increase of the current})/(A\sec \text{ for total discharge})]\times Vpolc0. \quad (3)$$

The Asec for the total discharge is expressed by:

Asec for total discharge=Asec during the increase of the current+ Asec during the decrease of the current.

Figure 5:
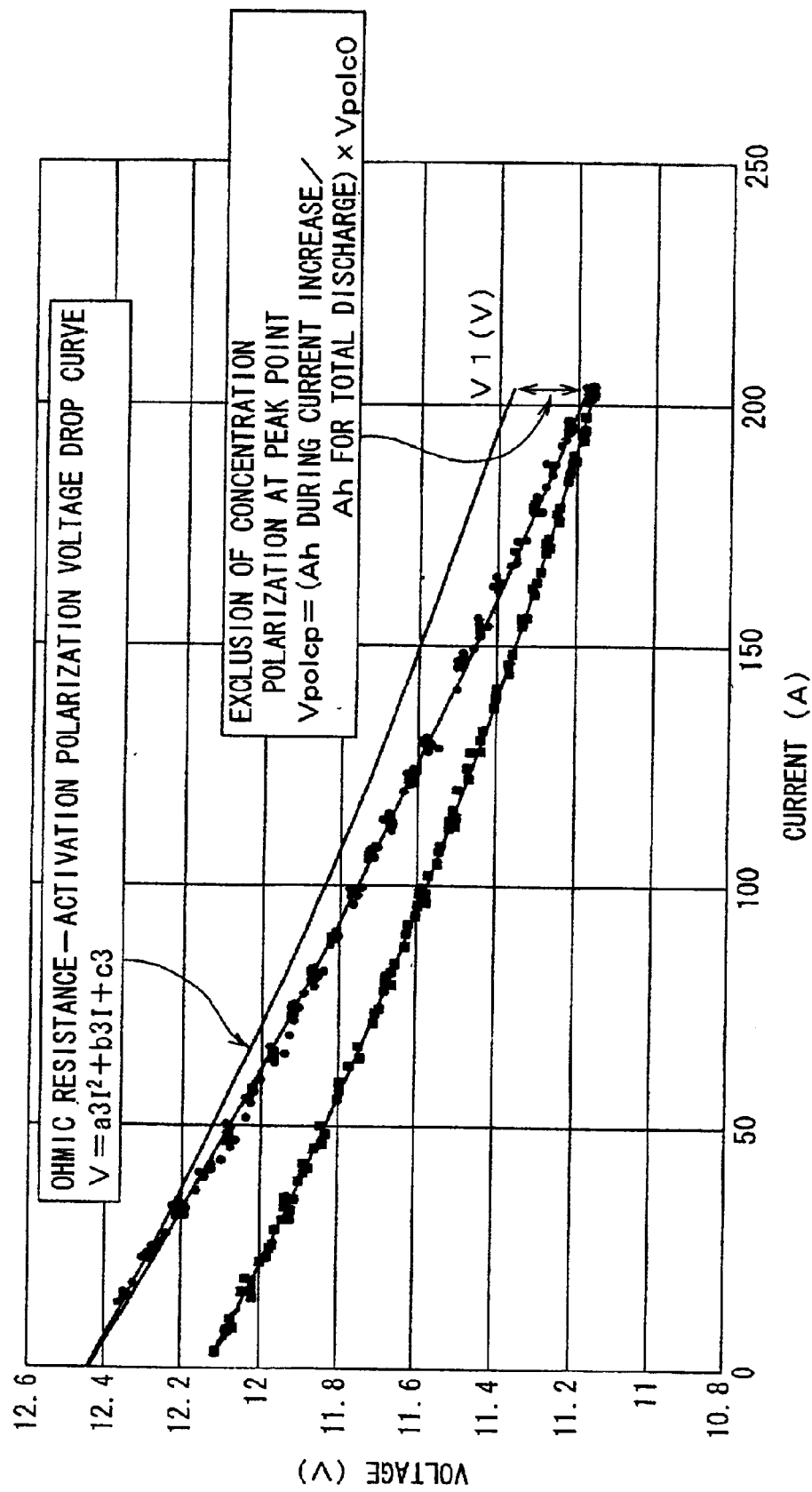
FIG. 5 is a graph for illustrating an example of a method of excluding the concentration polarization component from an approximate expression during current increase.

The concentration polarization Vpolcp at the peak value thus obtained is added to the voltage at the peak value in expression (1), thereby the concentration polarization component at the peak value is excluded as shown in FIG. 5. Supposing that the voltage after the concentration polarization component at the peak value is excluded be expressed by V1, the V1 is expressed by:

$$V1=a1Ip^2+b1Ip+c1+Vpolcp,$$

wherein Ip is a current value at the peak value.

Then, a voltage drop curve including only the pure resistance and activation polarization as shown in FIG. 5 is obtained by using the V1 thus obtained, which is expressed by:

$$V=a3I^2+b3I+c3. \quad (4)$$

When the initial state of the I–V characteristic expressed by (1) and (4), that is, at the current=0 A, the polarization at the initial state is the same with each other, therefore c3=c1. Further, the current rapidly increases from the initial state of the current=0 A, on the other hand the reaction of the concentration polarization is slow. Therefore, supposing that the reaction hardly advances yet, because the differential values of the voltage at the current=0 A in expressions (1) and (4) are the same with each other, therefore b3=b1. Consequently, expression (4) is expressed by:

$$V=a3I^2+b1I+c1. \quad (5)$$

Now an unknown factor is only a3.

Then, the coordinate values (Ip, V1) is substituted into the expression (5), thereby a3 is expressed as follows:

$$a3=(V1-b1Ip--c1)/Ip^2.$$

Therefore, expression (4) of the voltage drop curve including only the pure resistance and activation polarization component is determined by expression (5).

In general, because the pure resistance arises due to a chemical reaction, therefore it remains constant while the starter motor is in one operation provided that the state of charge (SOC) of the battery and temperature remain the same. To the contrary, the activation polarization component is a resistance which arises as a result of a chemical reaction, in which ions or electrons are transferred, the activation polarization and the concentration polarization affect each other, and a curve during current increase for the activation polarization does not completely agree with a curve during current decrease for the activation polarization. Therefore, expression (5) indicates a curve during current increase for the pure resistance and the activation polarization, which excludes the concentration polarization component.

In the following, a method will be explained, by which the concentration polarization component is excluded from a curve during current decrease. A relation between the pure resistance and the activation polarization during current decrease can be obtained by a similar method to that for excluding the concentration polarization at the current peak value. Supposing that two points except for the peak value be A point and B point, the concentration polarization VpolcA or VpolcB at each point can be obtained by:

$$VpolcA=[(Asec \text{ from the start of the current increase to } A \text{ point})/(Asec \text{ for total discharge})] \times Vpolc0 \quad (6)$$

$$VpolcB=[(Asec \text{ from the start of the current increase to } B \text{ point})/(Asec \text{ for total discharge})] \times Vpolc0. \quad (7)$$

Figure 6:
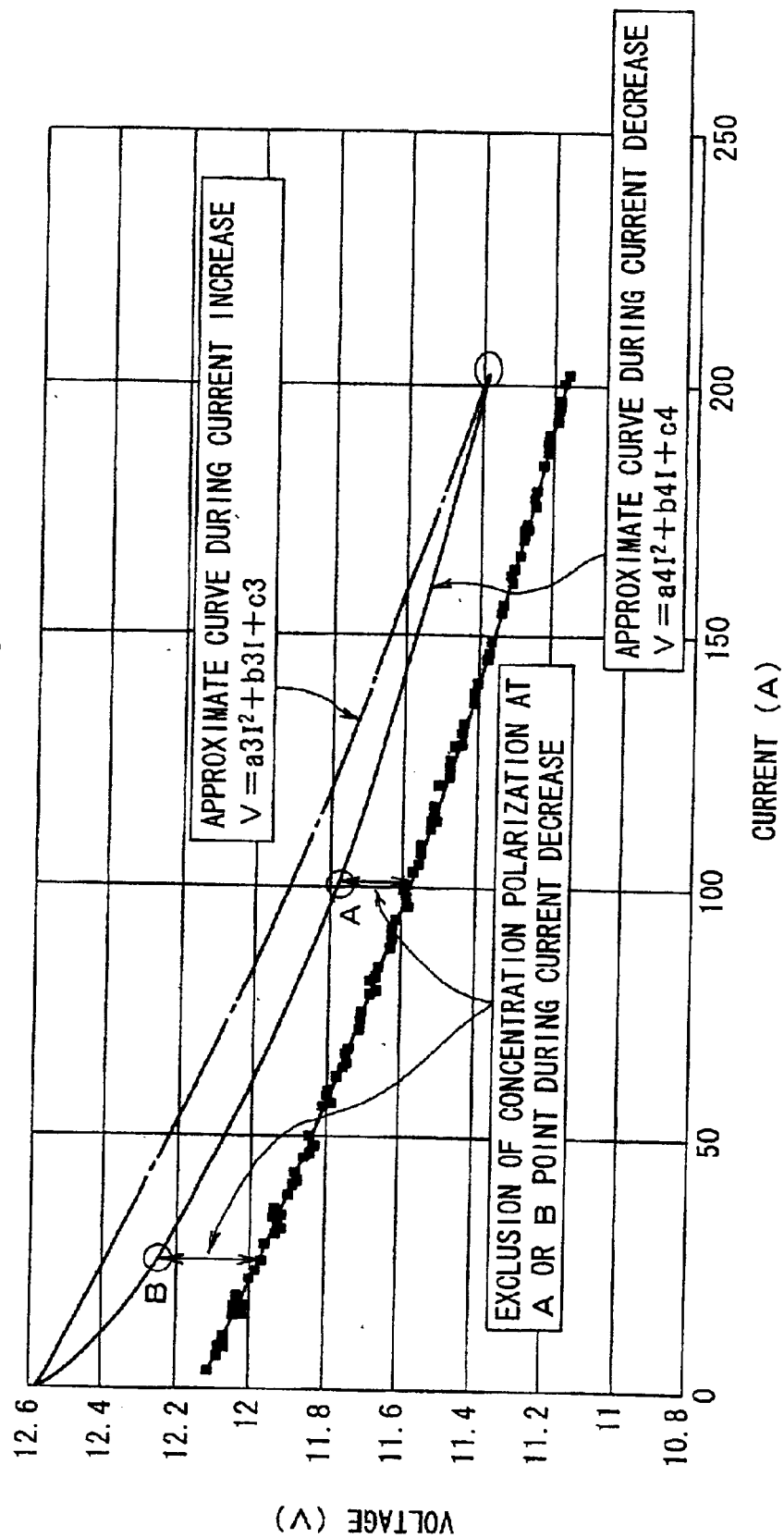
FIG. 6 is a graph for illustrating an example of a method of excluding the concentration polarization component from an approximate expression during current decrease.

When the two points, in which the concentration polarization component is excluded, besides the peak value point, are obtained, then by using the coordinate of the three points consisting of the two points and the peak value point, the curve during current decrease regarding the pure resistance and the activation polarization can be obtained as shown in FIG. 6.

$$V=a4I^2+b4I+c4 \quad (8)$$

The coefficients a4, b4 and c4 can be determined by solving three simultaneous equations, which are obtained by substituting the current and voltage values at the two points A and B and the peak value point into expression (8).

In the following, a method of calculating the pure resistance will be explained. A difference between the curve during current increase regarding the pure resistance and activation polarization, in which the concentration polarization component expressed by expression (5) is excluded, and the curve during current decrease regarding the pure resistance and activation polarization, in which the concentration polarization component expressed by expression (8) is excluded, is attributed to a difference in the activation polarization component values. Consequently, the pure resistance can be calculated by excluding the activation polarization component.

By considering the peak values of both curves, at which each activation polarization becomes the same, a differential value R1 during current increase at the peak value and a differential value R2 during current decrease at the peak value are calculated by the following expressions:

$$R1=2 \times a3 \times Ip \times b3 \quad (10)$$

$$R2=2 \times a4 \times Ip \times b4. \quad (11)$$

The difference between the R1 and R2 is because one is the peak value for the increase in the activation polarization while the other is the peak value for the decrease in the activation polarization. When as a simulation of the discharge corresponding to the rush current, the battery is subjected to a discharge, in which the discharge current is increased from zero to 200 A in 0.25 second and decreased from 200 A to zero in 0.25 second, by using an electronic load, the rate of change of the two near the peak value is the same, therefore it can be considered that there is a current-voltage characteristic due to the pure resistance in the middle of the two. Consequently, by adding both differential values followed by dividing by 2, the pure resistance R can be calculated by the following expression:

$$R=(R1+R2)/2. \quad (12)$$

Explained above is a case in which the battery is subjected to a simulation of the discharge corresponding to the rush current by using an electronic load. In a case of an actual vehicle, if a direct current motor is used as a starter motor, the current approaches a peak value while the rush current flows into a field coil and a cranking is in action in which the current drops to not more than half of the peak current value after reaching the peak value. Therefore, the discharge during current increase is finished in a short period of time such as 3 msec and this rapid change in the current causes no concentration polarization at the peak value during current increase. On the other hand, regarding the discharge during current decrease, the discharge current flows for longer period of time such as 150 msec compared to the discharge during current increase, therefore a large concentration polarization arises despite the decrease in the discharge current. However, because a different kind of phenomenon kind arises while the rush current flows regarding the cranking period of time, the values of discharge current and terminal voltage during this cranking period of time should not be used as data for determining the current-voltage characteristic during current decrease.

Figure 7:
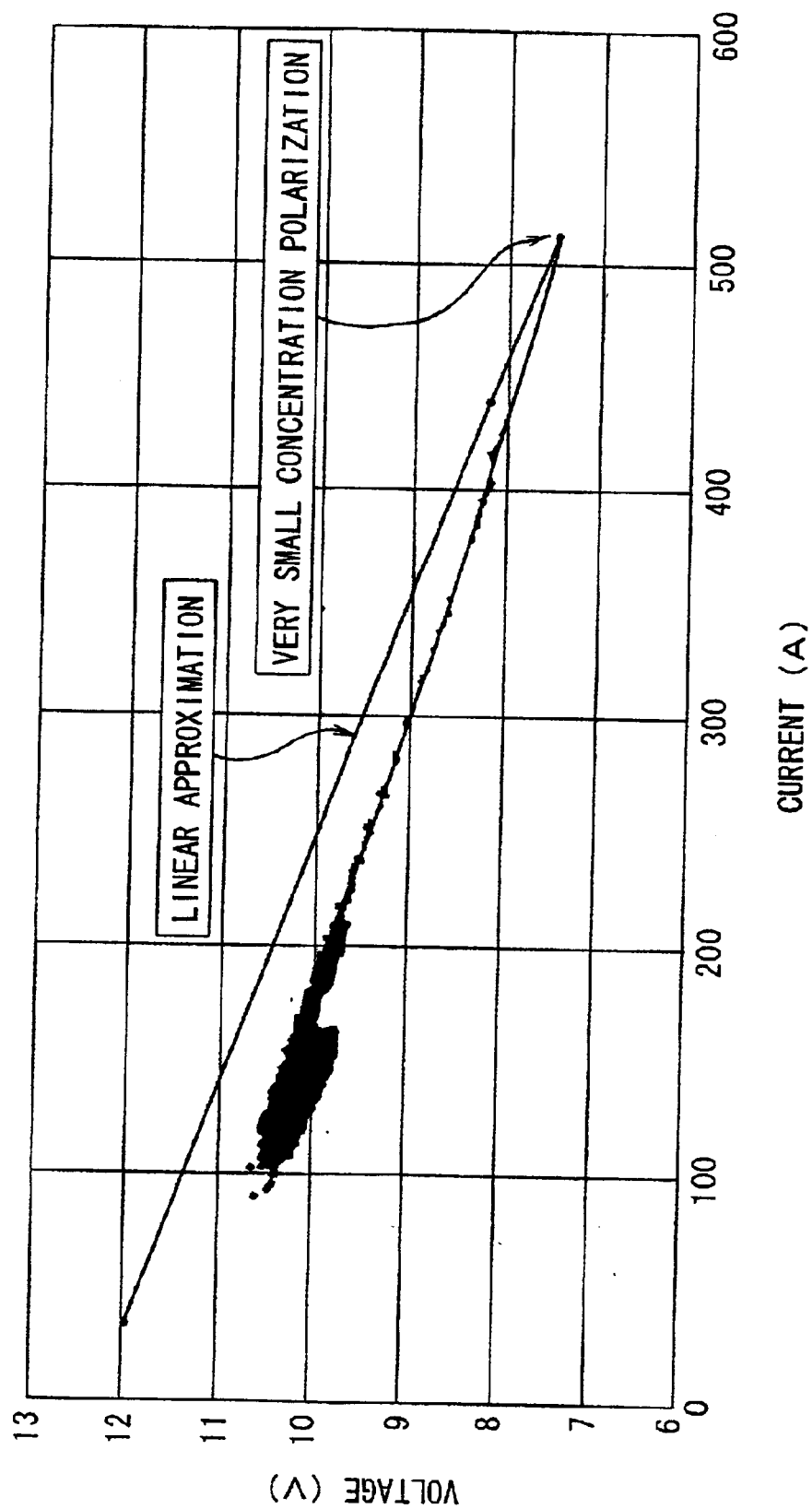
FIG. 7 is a graph illustrating an example of an I–V characteristic expressed by a linear approximate expression during current increase.

In this situation, as shown in FIG. 7, as for a real vehicle, the I–V characteristic during current increase can be approximated by a straight line, which is formed by combining a starting point of current increase and the peak value. Further, the concentration polarization at the peak value of 500 A can be approximated to be zero. In this case, the gradient of the approximate straight line during current increase is used as the differential value at the peak value during current increase.

However in this case, the gradient of the approximate straight line during current increase and a gradient of a tangent line of a quadratic approximate expression during current decrease at the peak point cannot simply be averaged. Because in this situation, the degree of the activation polarization generation is entirely different before and after the peak point, the presupposition that the rate of change of both near the peak value become the same cannot be realized.

Therefore, in this case, when the pure resistance is being computed, two values (that is, gradient values) of the terminal voltage change per unit current change at points corresponding to the peak value of the first and second approximate expressions, in which the voltage drop caused by the concentration polarization is excluded, are multiplied by ratios of time period of monotonic current increase and decrease, respectively, relative to the total time period while the rush current flows, and thereafter each product can be averaged. Thereby, the pure resistance can be calculated taking that the activation polarization and concentration polarization affect each other into consideration. The activation polarization principally arises in response to the magnitude of the current value, but also is affected by the magnitude of the concentration polarization. That is, the larger the concentration polarization, the larger the activation polarization, and the smaller the concentration polarization, the smaller the activation polarization. In all cases, an intermediate value between said two values (that is, gradient values) described above can be measured as the pure resistance value of the battery.

For a recent vehicle, an alternating current motor, such as a magnet motor, which needs a three-phase input such as a DC brushless, has been frequently used. In such a motor, the rush current does not rapidly reach the peak value in a short period of time and it takes about 100 msec to reach, and because the concentration polarization arises during current increase, the current change curve during current increase needs a quadratic approximation similarly to the simulation of the discharge process.

Figure 8:
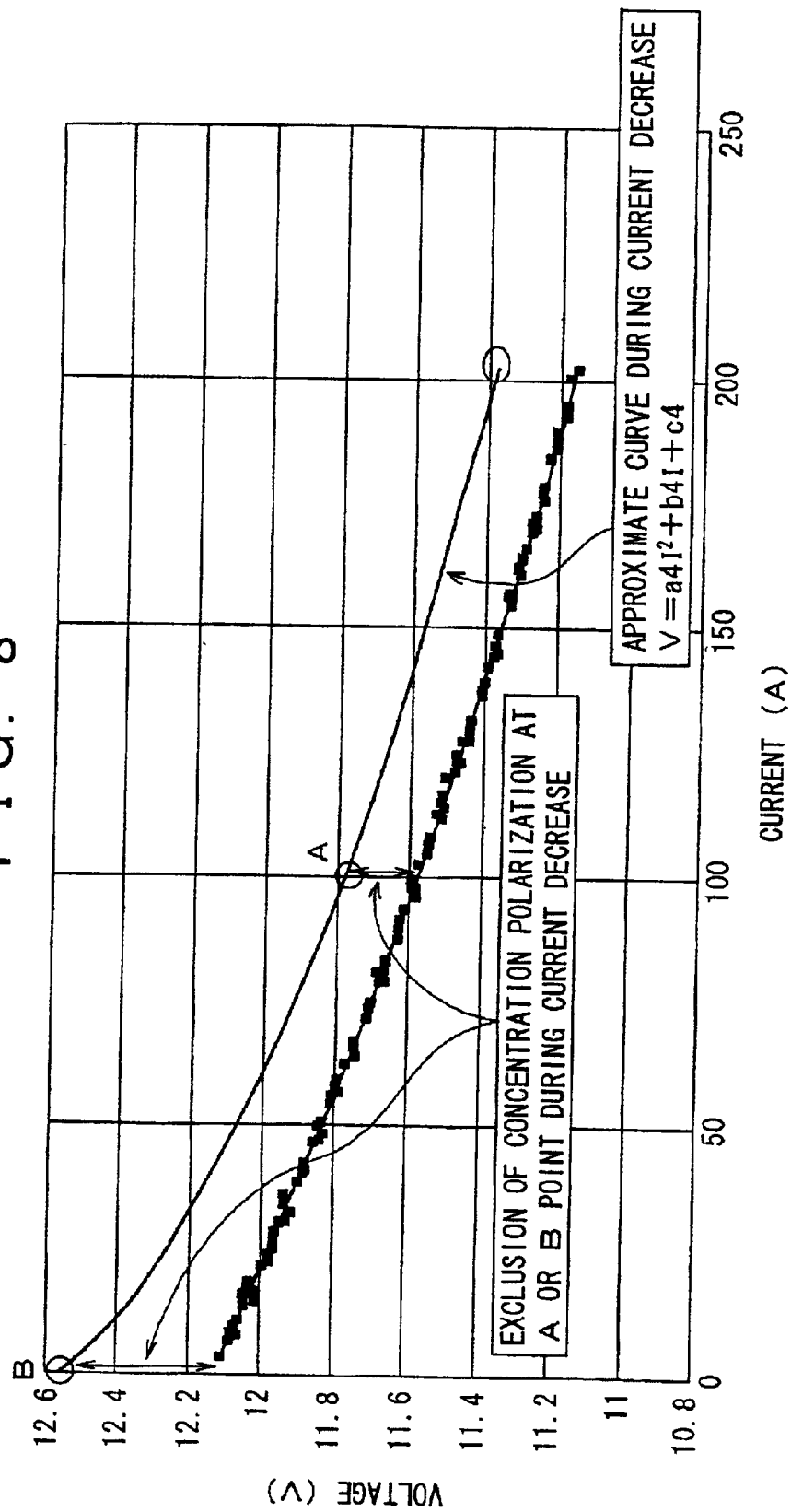
FIG. 8 is a graph for illustrating another example of a method of excluding the concentration polarization component from an approximate expression during current decrease.

When an approximation of the activation polarization during current decrease is carried out and when the peak value and two points except the peak value point are being determined, as shown in FIG. 8, a calculation for determining the approximate expression can be simplified by using a point of current=0 A as the B point.

Figure 9:
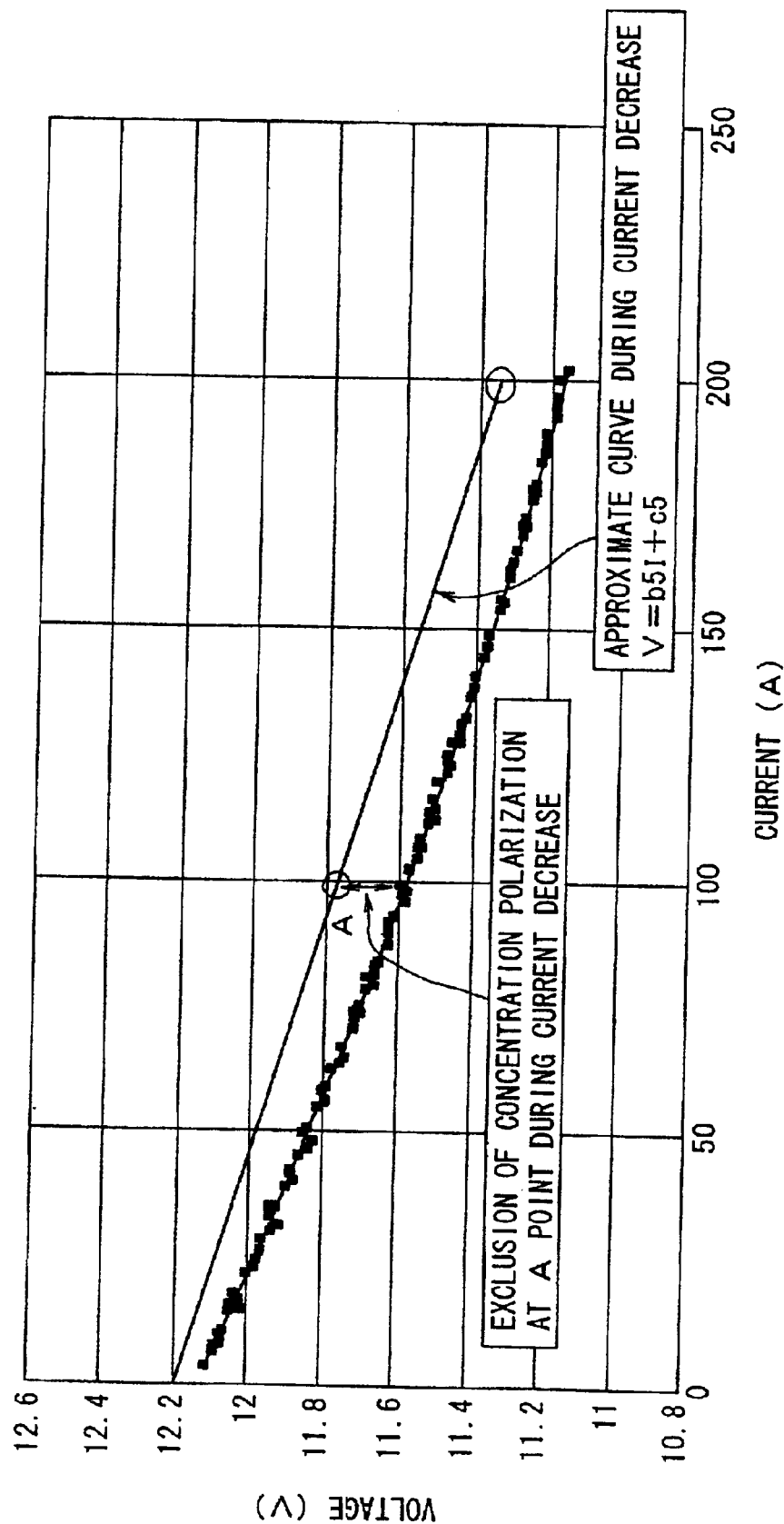
FIG. 9 is a graph for illustrating another example of a method of excluding the here concentration polarization component from an approximate expression during current decrease.

Further, for example, when a point corresponding to a current value being about half of the peak current is defined as a point at which the exclusion for the concentration polarization is carried out, as shown in FIG. 9, a straight line, which is formed by combining said point and the peak value point, may be used as a linear approximation. In this case, a gradient of an approximate straight line during current decrease is used as a differential value of the peak value during current decrease. Thereby, an accurate pure resistance of the battery can be obtained, the accuracy being about much the same as when a quadratic curve is used.

In the following, a method of measuring a pure resistance of an on-vehicle battery will be explained when, for example, a starter motor is used as a constant load. In this case, the rush current, with which the concentration polarization arises, flows during both the increase and the decrease in the discharge current.

When the constant load is in action, the discharge current flows from the battery, which monotonically increases exceeding a steady value and monotonically decreases from a peak value to the steady value. During that time, the discharge current and terminal voltage of the battery are periodically measured, for example, with a period of 100 $\mu$sec so as to obtain a number of data for pairs of the discharge current and terminal voltage of the battery.

The newest pair of the discharge current and terminal voltage thus obtained is collected for a specific period of time storing them in a memory as a rewritable storing means such as a RAM. On the basis of thus stored pairs and by least squares method, two quadratic approximate expressions (1) and (2) as described above are obtained, which are the current-voltage characteristic during increase and decrease in the discharge current, respectively, illustrating a correlation between the discharge current and terminal voltage. Thereafter, the voltage drop caused by the concentration polarization is excluded from the two approximate expressions, thereby modified quadratic approximate expressions that do not include the concentration polarization component are obtained.

For this purpose, a voltage difference between the expression (1) and (2) at the current=zero is calculated assuming that the voltage difference is a result of the concentration polarization and that there is no voltage drop as a result of the pure resistance and activation polarization. Further, by using this voltage difference, a voltage drop resulting from the concentration polarization at the current peak value on the approximate expression (1) of the I–V characteristic during current increase is determined. For this purpose, the concentration polarization changes depending upon the current-time product, which is a product between the magnitude of the current and a period of time while the current flows.

Then, by setting that a constant and a first-order coefficient of the approximate expression which does not include the concentration polarization component are the same as those of the approximate expression which includes the concentration polarization component, a second-order coefficient of the approximate expression which does not include the concentration polarization component is calculated. Thereby, the modified quadratic approximate expression (5) is obtained for an approximate expression of the I–V characteristic during current increase.

Then, an approximate expression which does not include the concentration polarization component is obtained from the approximate expression (2) for the I–V characteristic during current decrease. For this purpose, two points, at which the concentration polarization component is excluded, besides the peak value point are calculated. For this purpose, the concentration polarization changes depending upon the current-time product, which is a product between the magnitude of the current and a period of time while the current flows. Then, by using the coordinates of the two points and the peak value point, the modified quadratic approximate expression (8) is obtained for an approximate expression (2) of the I–V characteristic during current decrease.

Because the difference between the modified quadratic approximate expressions (5) and (8) is due to a difference of the activation polarization component, the pure resistance of the battery can be calculated by excluding the activation polarization component therefrom. A difference between the differential value for current increase and that for current decrease at the peak value is principally attributed to the fact that one is a value during activation polarization increase while the other is a value during activation polarization decrease. However, supposing that there is an I–V characteristic resulting from the pure resistance of the battery in the middle of both rates of change in the vicinity of the peak value, both differential values are multiplied by ratios of time period of monotonic current increase and decrease, respectively, relative to the total time period while the rush current flows, and thereafter each product is averaged, thereby the pure resistance of the battery can be calculated.

For example, supposing that the time period of current increase be 3 msec and that of current decrease be 100 msec, and that the differential value of current increase at the peak value be Rpolk1 and that of current decrease be Rpolk2, then the pure resistance R of the battery can be calculated by the following expression:

$$R = \text{Rpolk1} \times 100/103 + \text{Rpolk2} \times 3/103.$$

A preferred embodiment of a device for carrying out the method for measuring the pure resistance of an on-vehicle battery according to the present invention will be explained with reference to FIG. 2.

Figure 1:
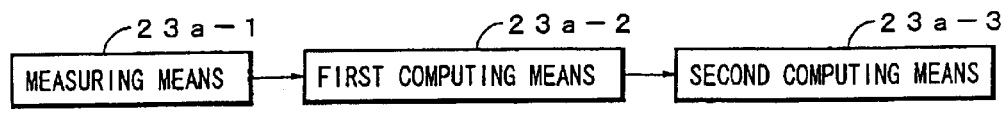
FIG. 1 is a block diagram illustrating a basic arrangement of a device for measuring a pure resistance of an on-vehicle battery according to the present invention.
Figure 2:
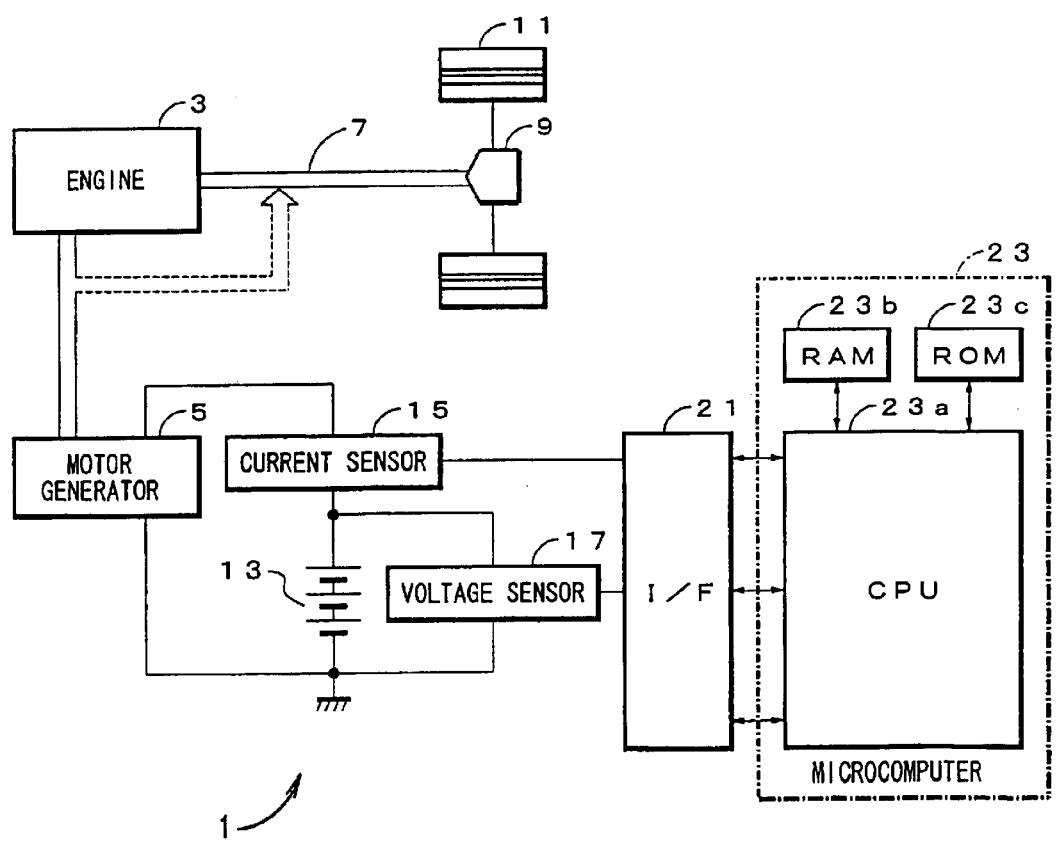
FIG. 2 illustrates a primary arrangement of a preferred embodiment of a device for measuring a pure resistance of an on-vehicle battery, to which a method of measuring a pure resistance of an on-vehicle battery according to the present invention is applied.

FIG. 2 illustrates a primary arrangement of a preferred embodiment of a device for measuring a pure resistance of an on-vehicle battery, to which a method of measuring a pure resistance of an on-vehicle battery according to the present invention is applied. The device 1 for measuring a pure resistance of an on-vehicle battery is mounted on a hybrid vehicle having an engine 3 and motor generator 5.

In the hybrid vehicle, normally only an output of the engine 3 is transferred from a drive shaft 7 to a wheel 11 by way of a differential case 9. On the other hand, for a high-load period of time, the motor generator 5 functions as a motor with an electric power from a battery 13, thereby the output from the motor generator 5 in addition to the output from the battery 13 is transferred from the drive shaft 7 to the wheel so as to carry out a assist traveling.

Further, in the hybrid vehicle, the motor generator 5 functions as a generator upon deceleration or braking, thereby kinetic energy is converted to electric energy so as to charge the battery 13.

Further, the motor generator 5 is used as a starter motor for forcibly rotate a flywheel of the engine 3 upon start of the engine 3 in response to a starter switch being turned on and at that time the motor generator 5 receives a large rush current in a short period of time. When the motor generator 5 starts the engine 3 in response to a starter switch being turned on, in response to an operation of an ignition key (not shown) being released, the starter switch is turned off, then an ignition switch and accessory switch are turned on. Accordingly, a discharge current from the battery 13 becomes a steady current.

The device 1 includes a current sensor 15, which detects a discharge current I of the battery 13 with respect to electric components such as a motor for assist traveling and the motor generator 5 functioning as a starter motor and a charge current from the motor generator 5 functioning as a generator to the battery 13, and a voltage sensor 17, which has a resistance of about 1 million ohm connected in parallel to the battery 13 and detects a terminal voltage V of the battery 13.

The device further includes a microcomputer 23, into which the outputs of the current sensor 15 and voltage sensor 17 are taken after their analog/digital (A/D) conversion in an interface circuit 21 (hereinafter, I/F).

The microcomputer 23 includes a CPU 23a, RAM 23b, and ROM 23c, wherein the CPU 23a is connected to the RAM 23b, ROM 23c, the I/F 21 described above, the starter switch, ignition switch, accessory switch, and switches of the electric components (loads) except the motor generator 5.

The RAM 23b has a data area for storing various data and a work area for use in various processes. A control program, according to which the CPU 23a carries out various processes, is installed in the ROM 23c.

A current value and voltage value, which are the outputs from the current sensor 15 and voltage sensor 17, respectively, are rapidly collected with a short period of frequency and taken into the CPU 23a of the microcomputer 23 by way of the I/F 21. The current value and voltage value thus taken are collected in a data area (corresponding to storing means) of the RAM 23b and used for various processes.

In the following, the process that the CPU 23a carries out according to the control program stored in the ROM 23c will be explained with reference to a flow chart in FIG. 10.

When the microcomputer 23 starts being supplied with an electric power from the battery 13 and the program starts, first the CPU 23a carries out an initialization (step S1).

When the initialization in step S1 is finished, the CPU 23a judges whether or not the ignition (IG) switch is turned on (step S2). If not turned on, another process is carried out (step S3). In the process in step S3, the discharge current and terminal voltage are measured and collected with a sampling period of time 500 $\mu$sec and the process is repeated until the CPU 23a judges that the ignition (IG) switch is turned on. When the IG switch being turned on is detected (Y in step S2), the sampling period of time is shortened from 500 $\mu$sec to 100 $\mu$sec (step S4) so that the rush current can be measured, which rapidly changes upon driving of the starter motor.

Thereafter, a pair of an A/D converted values of the discharge current I detected by the current sensor 15 and the terminal voltage V detected by the voltage sensor is read in through the I/F 21 and a collection process of real data, in which the real data read in are stored in the data area of the RAM 23b, is carried out (step S5).

While the real data are collected, a peak value of the rush current is detected by comparing the relation of magnitude between the real data consecutively collected (step S6). When the peak value is detected (Y in step S6), a period of time from the detection of the peak value is measured, the collection of the real data is continued until a predetermined period of time passes, and when the predetermined period of time passes (Y in step S7), the real data for a predetermined period before and after the peak value are kept (step S8), and after a predetermined period of time from the detection of the peak value, the sampling frequency is restored to 500 $\mu$sec (step S9).

Then, the collected and stored real data for the predetermined period of time are analyzed and judged whether or not they are suitable for computing a quadratic approximate expression of the current-voltage characteristic by using least squares method. That is, an analysis process is carried out (step S10), in which whether a discharge current monotonically increasing from zero to the peak value and a discharge current monotonically decreasing from the peak value to a steady value flow or do not flow is analyzed.

If judged that they are suitable as a result of the analysis in step S10 (Y in step 11), a computing process of approximate curve expression is carried out (step S12), in which a quadratic approximate expression of the current-voltage characteristic expressed by the expression (1) and (2) with respect to the increasing and decreasing discharge current is computed.

On the basis of the quadratic approximate expression computed in step S12, a computing process for computing the pure resistance of the battery is carried out (step S13). In this computing process, when the quadratic approximate expression includes a voltage drop caused by a concentration polarization component, a computing process of a modified quadratic approximate expression is carried out, in which a modified quadratic approximate expression excluding the voltage drop is computed, and the computing process for computing the pure resistance of the battery is carried out on the basis of the modified quadratic approximate expression. In this case, after computing a differential value at the peak vale of two modified quadratic approximate expressions of the current-voltage characteristic with respect to the increasing and decreasing discharge current, a computation is carried out, in which an intermediate value of the two differential values is computed as the pure resistance of the battery. Then, the pure resistance of the battery thus computed is stored in the data area of the RAM 23b in order to use it for various purposes (step S14). When the process in step S14 is finished, the system waits for that the judgment in step S2 becomes Y.

There are two methods of computing the intermediate valve of the differential values depending upon how the rush current flows.

If the period of time for rush current increase and that for rush current decrease are about the same, an average value of the two differential values is computed as the pure resistance.

On the other hand, if both time periods are significantly different from each other, a differential value of the modified quadratic approximate expression of I–V characteristic for the increasing discharge current at the peak value is multiplied by a ratio of the time period for increasing discharge current flow to the total time period of discharge current, two differential values of the modified quadratic approximate expression of I–V characteristic for the decreasing discharge current at the peak value is multiplied by a ratio of the time period for decreasing discharge current flow to the total time period of discharge current, and thus obtained two products are added to each other. Thereby, the added value is computed as the pure resistance.

In either case, the pure resistance of the battery is computed as an intermediate value between the two differential values.

Figure 10:
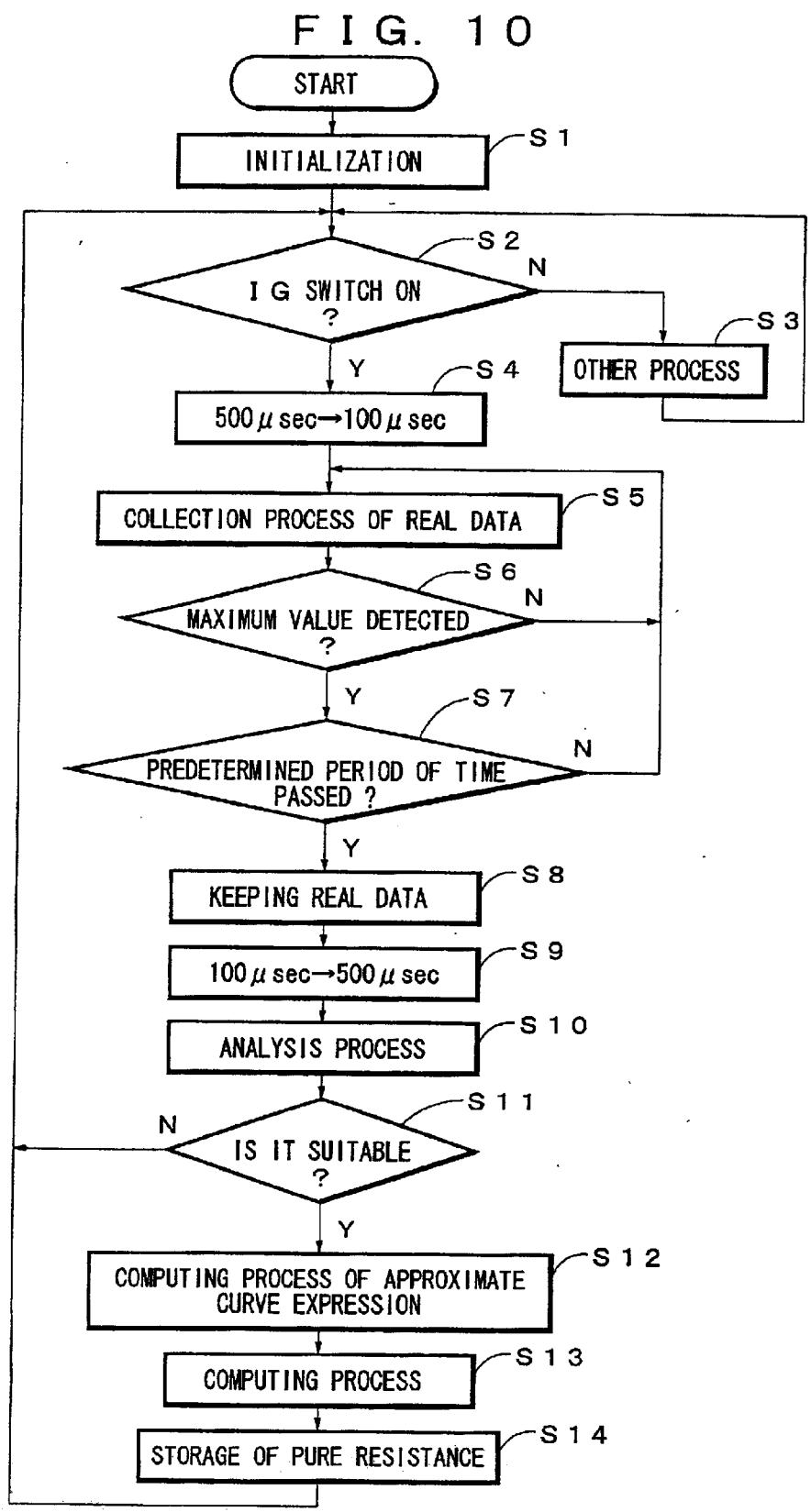
FIG. 10 is a flow chart illustrating a process that a microcomputer in FIG. 2 performs for measuring a pure resistance of a battery in accordance with a predetermined program.

In the example shown in the flow chart in FIG. 10, the first and second approximate expression are quadratic approximate expressions. However, when the first approximate expression is linear, a process for computing the modified approximate expression becomes unnecessary. In this case, the gradient of the linear expression is replaced by a differential value.

In the device 1, the step S5 in the flow chart corresponds to a process for the measuring means for measuring current and voltage, the step S12 corresponds to the first computing means, and the step S13 corresponds to the second computing means.

In the following, an operation of the device 1 will be explained.

When the starter motor is started and the battery 13 is in a discharging state, the discharge current and terminal voltage of the battery are periodically measured when the rush current flows into the starter motor, the rush current exceeding the steady value and monotonically increasing, and the rush current monotonically decreases from the peak value to the steady value.

In the device 1, the real data of the discharge current I and terminal voltage V periodically measured before and after the peak value for a predetermined period of time are stored in the data area of the RAM 23b. The thus collected real data are analyzed and judged whether they are suitable for computing the quadratic approximate expression of I–V characteristic or not by using least squares method. That is, it is analyzed whether or not the discharge current flows, the discharge current exceeding the steady value and monotonically increases, and the discharge current monotonically decreases from the peak value to a value not more than the steady value.

Consequently, no process for computing the approximate curve expression is carried out until the suitable data for computing the quadratic approximate expression of I–V characteristic is finally collected, and the process can be carried out by using the real data for the predetermined time period already collected. Therefore, the process need not be synchronized with the periodical measurement of the discharge current and terminal voltage, and a high rate of processing is not needed.

The present invention also can be applied to a load besides a starter motor, into which the rush current flows upon start of driving. In this case, instead of the IG switch, a switching-on operation of the load is detected and the process of step S4 is carried out. Other processes are substantially the same as the processes shown in the flow chart in FIG. 10.

In the preferred embodiment described above, a difference between the terminal voltages of the first and second approximate expressions at the discharge current being zero is considered to be a voltage drop caused by a total concentration polarization component arisen while the rush current increases from zero to the peak value and decreases from the peak value to zero, and a voltage drop caused by a concentration polarization component arising while the rush current increases from zero to the peak value among the total concentration polarization component is computed by multiplying a difference between the terminal voltage of the battery at a point of the discharge current being zero of the first and second approximate expressions, by a ratio of a current-time product while the rush current increases from zero to a peak value to a current-time product while the rush current first increases from zero to a peak value and subsequently decreases from the peak value to zero. Instead, the voltage drop can be computed by another method, which will be explained as follows:

Supposing that the difference between the first and second approximate expressions is attributed to a difference in the concentration polarization component, by using a difference expression between the two expressions, the difference between the two can be signified for the concentration polarization, which is the same each other at the peak current value, changing while the current changes from the peak current value to zero. Further, on the basis of the difference expression, the change in the concentration polarization component while the current changes from zero to the peak current value can be estimated.

A difference between the expressions (1) and (2) is expressed by:

$$V = (a1-a2)I^2 + (b1-b2)I + (c1-c2). \quad (21)$$

Figure 11:
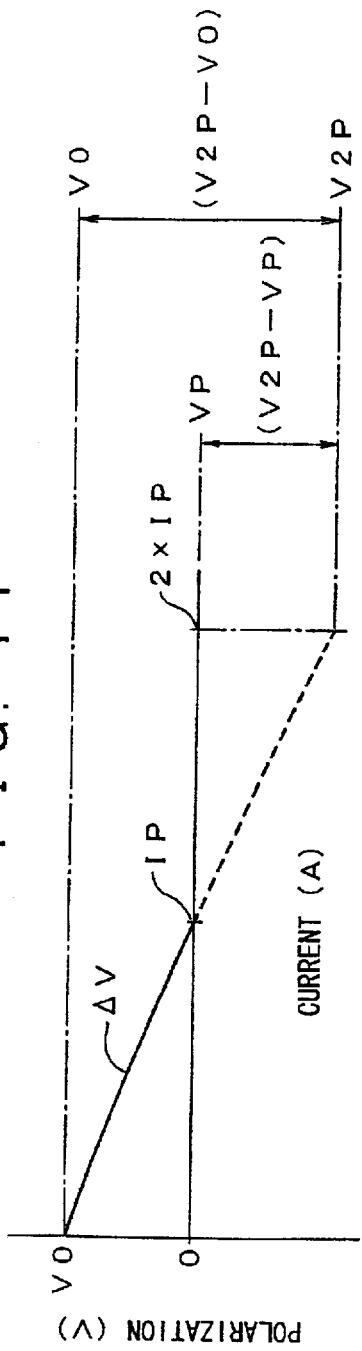
FIG. 11 is a graph for illustrating a method of computing a concentration polarization component at a point of a peak current value and an optional point on the basis of an expression, which is obtained by calculating a difference between the expressions (1) and (2)
Figure 13:
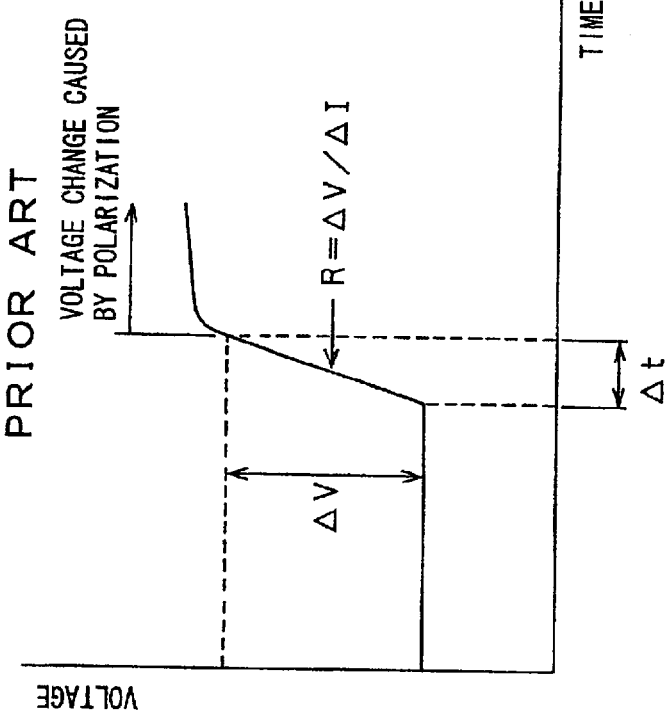
FIG. 13 is a graph illustrating a conventional method of measuring a pure resistance of a battery.
Figure 12:
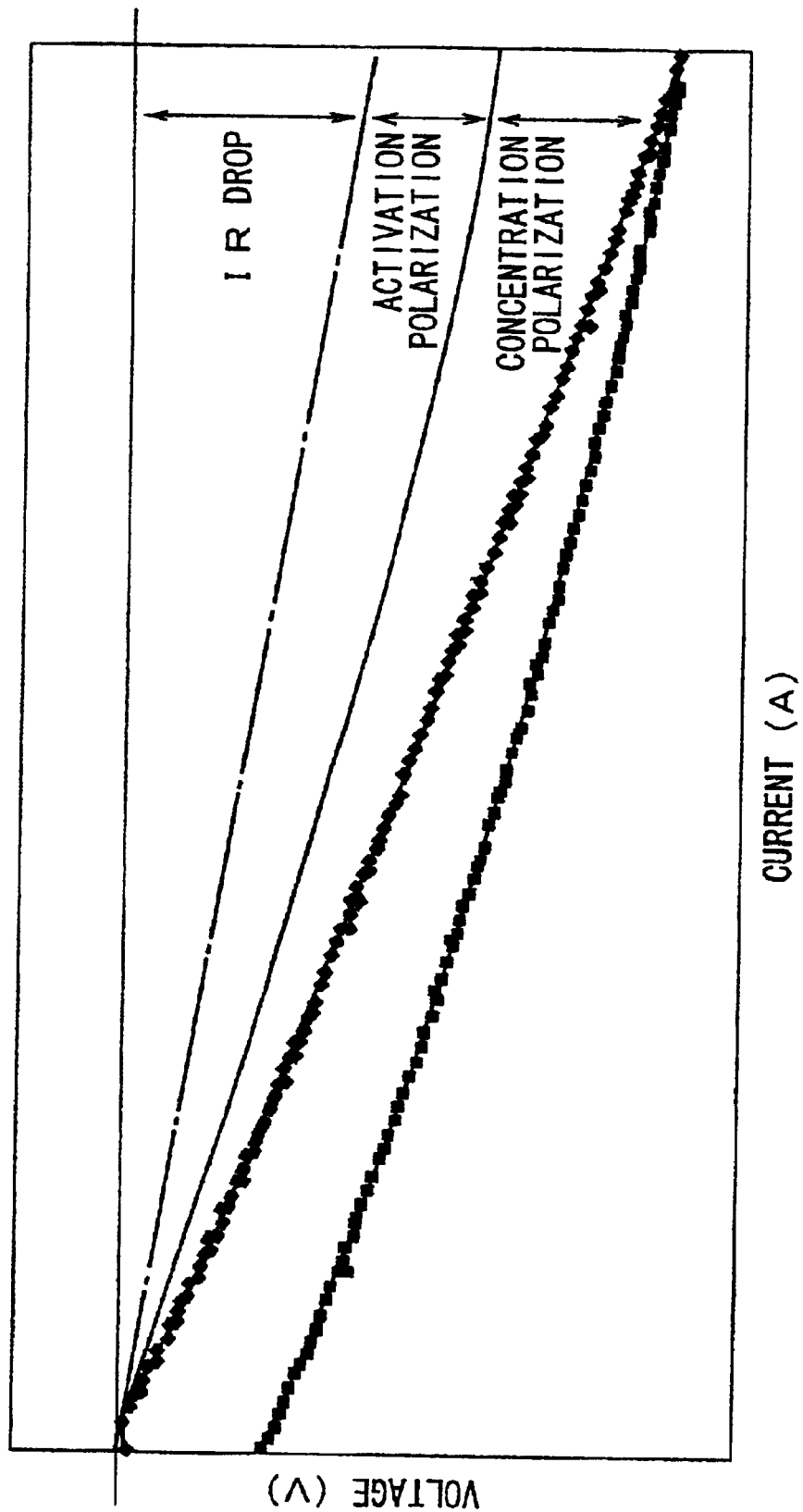
FIG. 12 is a graph illustrating an I–V characteristic, which generally itemizes the voltage drop of the terminal voltage during discharge.

When this curve is plotted, as shown in FIG. 11, a curve is drawn, in which the concentration polarization component at the peak current value is zero, and the curve illustrates only a change in the concentration polarization component up to a point where the current value is zero. The curve expressed by expression (21) is shown by dotted line in FIG. 11. As is shown by the dotted line, by extending a line up to a point of twice the peak current value, the change in the concentration polarization component while the current changes from zero to the peak current value can be estimated. That is, a relative change in the concentration polarization during current increase and decrease is estimated on the basis of the difference expression.

Because the difference expression expresses the behavior of the generation and change of the concentration polarization for the time period of the current being from zero to the peak value and from the peak value to zero by condensing them into the behavior for the time period of the current being from zero to the peak value, therefore, by extrapolating the curve expressed by the difference expression up to a point of twice the discharge current, the behavior of the change in the concentration polarization can be estimated when the current changes from zero to the peak value and from the peak value to zero. Consequently, even in such a case that the linear relation between the current-time product and the concentration polarization is disturbed and accordingly the accuracy of the concentration polarization value at any point estimated from the current-time product value deteriorates, the difference expression is effectively applicable.

Then, a ratio of a difference (V2p−Vp) between a voltage value Vp at a point of the peak current value and a voltage value V2p at a point of twice the peak current value, to a difference (V2p V0) between a voltage value V0 at a point of the current value being zero and a voltage value V2p at a point of twice the peak current value, is calculated and thereafter, the ratio is multiplied by the concentration polarization Vpolc0 at a point of the current being zero, which is a voltage difference between an intercept of the approximate curve during current increase and an intercept of the approximate curve during current decrease, thereby the concentration polarization component at a point of the peak current value is estimated. The estimated concentration polarization component can be treated similarly to the Vpolcp described above and a voltage drop curve resulting from only the pure resistance and activation polarization can be computed.

When the concentration polarization component is to be excluded from the current decrease curve, a similar method as an exclusion of the concentration polarization at a point of the current peak value can be used. That is, voltage values at two points except the peak value are calculated by the expression (21), a ratio of a difference between the two voltage values at points except the peak current value and a voltage value V2p at a point of twice the peak current value, to a difference (V2p−V0) between a voltage value V0 at a point of the current value being zero and a voltage value V2p at a point of twice the peak current value, is calculated and thereafter, the ratio is multiplied by the concentration polarization Vpolc0 at a point of the current being zero, which is a voltage difference between an intercept of the approximate curve during current increase and an intercept of the approximate curve during current decrease, thereby the concentration polarization component at each point is estimated. By using thus estimated concentration polarization component at the two points together with the concentration polarization component at a point of the peak current value, a voltage rise curve resulting from only the pure resistance and activation polarization can be computed.

A method for computing the pure resistance of a battery by using modified approximate expressions of thus calculated voltage drop and rise curves can be carried out in a manner similar to the method in case of the modified approximate expression obtained by using the current-time product as described above.

What is claimed is:

1. A method of measuring a pure resistance of an on-vehicle battery for supplying electric power to loads in the vehicle comprising the steps of:

periodically measuring a discharge current and terminal voltage of the battery while a rush current flows into a predetermined constant, the rush current first monotonically increasing from zero to a peak value and subsequently monotonically decreasing from the peak value to a steady value;

computing a first approximate expression of a current-voltage characteristic for the increasing discharge current and a second approximate expression of a current-voltage characteristic for the decreasing discharge current, said current-voltage characteristic indicating a correlation between the discharge current and terminal voltage of the battery; and computing an intermediate value of two values of the terminal voltage change per unit current change at points corresponding to the peak values of the first and second approximate expressions excluding a voltage drop caused by a concentration polarization component when the first and second approximate expressions include the voltage drop, wherein the intermediate value computed is measured as the pure resistance of the battery.

2. The method according to claim 1, wherein the intermediate value is computed by averaging the two values of the terminal voltage change.

3. The method according to claim 1, wherein each said value of the terminal voltage change is first multiplied by a corresponding ratio of a monotonic increase period of time and monotonic decrease period of time of the rush current among a total period of time of the rush current flow, respectively, and subsequently the intermediate value is computed by averaging the two multiplied values of the terminal voltage change.

4. The method as claimed in any one of claims 1–3, wherein if the first and second approximate expressions are quadratic, upon computation of the intermediate value, first and second modified approximate expressions are computed, in which the voltage drop caused by the concentration polarization component is excluded, from the first and second approximate expressions, respectively, and two values of the terminal voltage change per unit current change at points corresponding to the peak values of the first and second modified approximate expressions are computed.

5. The method according to claim 4, wherein a difference between the terminal voltage of the battery at a point of the discharge current being zero of the first and second approximate expressions is computed, the difference is characterized as a voltage drop caused by a total concentration polarization component arisen while the rush current increases from zero to a peak value and decreases from the peak value to zero, a voltage drop caused by a concentration polarization component arisen while the rush current increases from zero to the peak value among the total concentration polarization component is computed, and a quadratic expression, a second-order coefficient of which is determined by substituting a value, which is obtained by subtracting said voltage drop from a voltage value corresponding to the peak value, into an expression having the same constant and first-order coefficient as those of the first quadratic approximate expression, is computed as the first modified approximate expression.

6. The method according to claim 5, wherein besides a voltage value excluding a voltage drop caused by the concentration polarization component at the peak value, two voltage values excluding a voltage drop caused by a concentration polarization component between a peak value and zero are computed and a quadratic expression, a coefficient of which is determined by using the three voltage values, is computed as the second modified approximate expression.

7. The method according to claim 6, wherein differential values of the first and second modified approximate expression at a peak value are used for computing the intermediate value.

8. The method according to claim 5, wherein besides a voltage value excluding a voltage drop caused by the concentration polarization component at the peak value, two voltage values excluding a voltage drop caused by a concentration polarization component at zero point and at an intermediate point between a peak value and zero are computed and a quadratic expression, a coefficient of which is determined by using the three voltage values, is computed as the second modified approximate expression.

9. The method according to claim 5, wherein besides a voltage value excluding a voltage drop caused by the concentration polarization component at the peak value, a voltage value excluding a voltage drop caused by a concentration polarization component at an intermediate point between a peak value and zero is computed, a linear expression determined by connecting two points of said voltage value is computed as the second modified approximate expression, and a gradient of the second modified approximate expression is used for computing the intermediate value.

10. The method according to claim 5, wherein a voltage drop caused by a concentration polarization component arisen while the rush current increases from zero to the peak value among the total concentration polarization component is computed by multiplying a difference between the terminal voltage of the battery at a point of the discharge current being zero of the first and second approximate expressions, by a ratio of a current-time product while the rush current increases from zero to a peak value to a current-time product while the rush current first increases from zero to a peak value and subsequently decreases from the peak value to zero.

11. The method according to claim 5, wherein an difference expression, which is a difference between the first and second approximate expressions, is calculated and thereafter, a voltage drop caused by a concentration polarization component arisen while the rush current changes from zero to the peak value is computed according to the steps of:

calculating a first difference in the terminal voltage of the battery between the first and second approximate expressions at a point of the discharge current being zero;

calculating a second difference between voltage values at a current value being zero and at a current value being twice the peak current value calculated on the basis of said difference expression;

calculating a third difference between voltage values at the peak current value and at twice the peak current value; and computing the voltage drop by multiplying the first difference by the ratio of the third difference to the second difference.

12. The method as claimed in any one of claims 1–3, wherein when the rush current, which monotonically increases up to a peak value in a short period of time without an occurrence of concentration polarization, flows into the constant load, the first approximate expression is linear and a gradient of the first approximate expression is used for computing the intermediate value.

13. A device for measuring a pure resistance of an on-vehicle battery for supplying electric power to loads in the vehicle comprising:

measuring means for periodically measuring a discharge current and terminal voltage of the battery while a rush current flows into a predetermined constant load of the loads, the rush current first monotonically increasing from zero to a peak value and subsequently monotonically decreasing from the peak value to a steady value;

first computing means for computing a first approximate expression of a current-voltage characteristic for the increasing discharge current and a second approximate expression of a current-voltage characteristic for the decreasing discharge current, said current-voltage characteristic indicating a correlation between the discharge current and terminal voltage of the battery measured by the measuring means; and second computing means for computing an intermediate value of two values of the terminal voltage, change per unit current change at points corresponding to the peak values of the first and second approximate expressions excluding a voltage drop caused by a concentration polarization component when the first and second approximate expression include the voltage drop, wherein the intermediate value computed by the second computing means is measured as the pure resistance of the battery.

\* \* \* \* \*